(12) United States Patent
Bilu et al.

(10) Patent No.: US 9,470,769 B2
(45) Date of Patent: Oct. 18, 2016

(54) MEANS AND METHODS FOR REDUCING THE ELECTROMAGNETIC ENERGY PROPAGATION FROM AN MRD'S MAGNET-BORE TO THE OUTER ENVIRONMENT SURROUNDING SAID MAGNET, AND VICE VERSA

(71) Applicant: Aspect Imaging Ltd., Shoham (IL)

(72) Inventors: Shaul Bilu, Netanya (IL); Zahi Inbar, Ness Ziona (IL); Amiel Raziel Greenberg, Mazkeret Batya (IL); Eran Toledo, Tel Aviv (IL)

(73) Assignee: ASPECT IMAGING, LTD., Shoham (IL)

( * ) Notice: Subject to any disclaimer, the term of this patent is extended or adjusted under 35 U.S.C. 154(b) by 491 days.

(21) Appl. No.: 13/941,638

(22) Filed: Jul. 15, 2013

(65) Prior Publication Data

US 2014/0253117 A1    Sep. 11, 2014

Related U.S. Application Data

(60) Provisional application No. 61/775,717, filed on Mar. 11, 2013.

(51) Int. Cl.
*G01V 3/00* (2006.01)
*G01R 33/422* (2006.01)
*G01R 33/28* (2006.01)

(52) U.S. Cl.
CPC .......... *G01R 33/422* (2013.01); *G01R 33/288* (2013.01)

(58) Field of Classification Search
USPC .......................................................... 324/318
See application file for complete search history.

(56) References Cited

U.S. PATENT DOCUMENTS

| 5,304,932 | A | | 4/1994 | Carlson | |
|---|---|---|---|---|---|
| 5,594,200 | A | * | 1/1997 | Ramsey | ............... H05K 9/0007 174/382 |
| 5,986,531 | A | * | 11/1999 | Carrozzi | ............... G01R 33/722 324/318 |
| 7,801,613 | B2 | | 9/2010 | Li et al. | |
| 2008/0060843 | A1 | * | 3/2008 | Ginanneschi | ........ G01R 33/422 174/378 |

FOREIGN PATENT DOCUMENTS

| EP | 0825450 | 2/1998 |
|---|---|---|
| JP | S62207448 | 9/1987 |
| JP | 2005270422 | 10/2005 |

OTHER PUBLICATIONS

International Search Report for PCT application No. PCT/IL2014/050244, mailing date Aug. 26, 2014.

* cited by examiner

*Primary Examiner* — Rodney Fuller
(74) *Attorney, Agent, or Firm* — Pearl Cohen Zedek Latzer Baratz LLP

(57) ABSTRACT

An electrically earthed protecting sleeve that reduces the electromagnetic energy propagation from a magnetic bore to the outer environment surrounding a magnet. The sleeve has a distal portion located within an open bore of an magnetic resonance device (MRD) and a proximal portion attachable to an aperture of the MRD. The sleeve accepts a non-imaged portion of a body portion inserted within the bore while the imaged portion protrudes from the distal end of sleeve.

6 Claims, 5 Drawing Sheets

MEANS AND METHODS FOR REDUCING THE ELECTROMAGNETIC ENERGY PROPAGATION FROM AN MRD'S MAGNET-BORE TO THE OUTER ENVIRONMENT SURROUNDING SAID MAGNET, AND VICE VERSA

This application claims the benefit of U.S. Provisional Patent Application No. 61/775,717, filed Mar. 11, 2013, which is incorporated by reference herein in its entirety.

FIELD OF THE INVENTION

The present invention pertains to means, such as a protecting sleeve, and methods for reducing the electromagnetic energy propagation from an MRD's magnet-bore to the outer environment surrounding said magnet, and vice versa.

BACKGROUND OF THE INVENTION

This invention relates to the field of magnetic resonance imaging (MRI), where radiofrequency (RF) magnetic fields are used to interrogate a region of interest. It is particularly directed towards the shielding of RF effects which occur from inside and outside of the MRI system.

One of the components in MRI systems is an RF coil, which is part of a typical MRI data gathering sequence. MRI RF signals of suitable frequencies are transmitted into the imaging volume and NMR responsive RF signals are then received from the imaging volume via one or more RF coils or antennae. Information encoded within the frequency and phase parameters of the received RF signals is then processed to form visual images representing the distribution of NMR nuclei within a cross-section or volume of the patient within the volume of interest (VOI) of the MRI system.

In MRI devices (MRDs) which are meant for imaging body extremities, only the portion to be examined in the MRI is located within the bore of the MRI system, whereas the rest of the body remains outside of the MRI. In such cases, RF signals from the volume outside the MRI may be collected through the conductive body and the extremity to be examined, having dielectric properties, may serve as a transceiver of RF signals, thus causing noise in signal collection during an MRI examination.

Additionally, RF fields within the MRI can induce an electrical current in the body which is transformed into energy in the form of heat. Heating of tissues is due to resistance in the tissues is called "ohmic heating". Specific Absorption Rate (SAR) is key variable in determining patient heating potential in an MR scanner is the RF power absorbed by the body per unit mass, generally measured in the unit of W/kg. If the SAR exceeds the thermal regulation capacity the patient's body temperature will rise.

U.S. Pat. No. 5,304,932 is directed towards shielding an MRI RF coil from extraneous noise sources using an extremely thin conductive shield interposed between the RF coil and the static magnetic structure of an MRI system. To control eddy currents induced in such a conductor by the changing magnetic flux of MRI gradient coils, the RF shield conductor thickness is less than three skin depths at the MRI RF operating frequencies of the RF coil. Preferably, the RF shield conductor thickness is on the order of only one skin depth or less.

U.S. Pat. No. 7,801,613 is directed towards housing of implantable medical devices in a titanium alloy that provides improved electrical performance, mechanical strength, and reduced MRI heating.

There thus remains a long felt need for reducing the electromagnetic energy propagation from MRI's magnet bore to the outer environment surrounding the magnet and vice versa, for a protecting means providing effective Faraday shielding used as a barrier between the internal and external RF fields, and for reducing SAR of a non-examined portion of a body extremity in the vicinity of a MRD.

SUMMARY OF THE INVENTION

It is thus an objet of the present invention to disclose, in an open bore MRD having a volume of interest for imaging a body portion and an inlet aperture for inserting said body portion within said bore, an electrically earthed protecting sleeve for reducing the electromagnetic energy propagation from said magnet bore to the outer environment surrounding said magnet and vice versa, said sleeve having a distal portion insertably locatable within said bore and a proximal portion attachable to the MRD aperture, length and diameter of said sleeve adapted to accept a non imaged portion of a body portion insertable within said bore whilst the imaged portion protrudes from said distal end of sleeve.

It is another object of the present invention to disclose, in connection to an open bore MRD having a volume of interest for imaging a body portion and an inlet aperture for inserting said body portion within said bore, an electrically earthed protecting sleeve for reducing the electromagnetic energy propagation from said magnet bore to the outer environment surrounding said magnet and vice versa, said sleeve having a proximal portion locatable outside said bore and a distal portion attachable to the MRD aperture.

It is another objet of the present invention to disclose a method for reducing the electromagnetic energy propagation from an MRD's magnet-bore to the outer environment surrounding said magnet, and vice versa; said method characterized by the following steps: providing said open bore to comprise a volume of interest (VOI) for imaging a body portion (IBP) and an inlet aperture for inserting said IBP within said VOI; providing a protective sleeve with length and diameter to accept a non-imaged portion of a body; inserting the distal portion of said sleeve within said bore whilst attaching its proximal end to said aperture; earth connecting said sleeve; and inserting a body portion throughout said aperture within said sleeve such that said IBP protrudes from said distal end of sleeve within said VOI and imaging the same.

It is still another objet of the present invention to disclose a method for reducing the electromagnetic energy propagation from an MRD's magnet-bore to the outer environment surrounding said magnet, and vice versa; said method characterized by the following steps: providing said open bore to comprise a volume of interest (VOI) for imaging a body portion (IBP) and an inlet aperture for inserting said IBP within said VOI; providing a protective sleeve with length and diameter to accept a non-imaged portion of a body; locating the proximal portion of said sleeve outside said bore whilst attaching its distal end to said aperture; earth connecting said sleeve; and, inserting a body portion within said sleeve and advancing its throughout said aperture such that said IBP protrudes from said distal end of sleeve, locating said IBP within said VOI and imaging the same.

It is lastly another object of the present invention to disclose a method for effectively reducing MRD's magnet-bore electrical cross-section from a first cross-section (internal RF shield) to a smaller second cross-section (patient's hand cross-section); said method comprising steps of inserting a body portion within the open bore of said MRD, enveloping a non-imaged body portion comprising at least one first body portion not to be imaged, and at least one second body portion to be imaged (IBP) by means of an RF protecting sleeve, and earth connecting at least one portion of said sleeve while imaging said IBP, thereby degenerating RF mode with respect to the MRD's RF operating frequency.

BRIEF DESCRIPTION OF THE DRAWINGS

The invention is herein described, by way of example only, with reference to the accompanying drawings, wherein.

DETAILED DESCRIPTION OF THE PREFERRED EMBODIMENTS

The following description is provided, alongside all chapters of the present invention, so as to enable any person skilled in the art to make use of the invention and sets forth the best modes contemplated by the inventor of carrying out this invention. Various modifications, however, are adapted to remain apparent to those skilled in the art, since the generic principles of the present invention have been defined specifically to provides means, such as a protecting sleeve, and methods for reducing the electromagnetic energy propagation from an MRD's magnet-bore to the outer environment surrounding said magnet, and vice versa The term "about" herein indicates a value within +25%. The term "Faraday shield" refers hereinafter to an enclosure formed by a conducting material or by a mesh of such material, blocking external static and non-static electric fields. The term "magnetic fringe field" refers hereinafter to spatial gradient magnetic field surrounding the bore of said MRI in three orthogonal magnetic gradients which produces an attractive translational force on ferromagnetic objects. The magnetic in that zone is between 300-5 Gauss and is delimited by a 5-Gauss line. (see FIGS. 8 and 9). The term "RF" refers hereinafter to radiofrequency (RF) in the range of about 3 kHz to 300 GHz.

Figure 1:
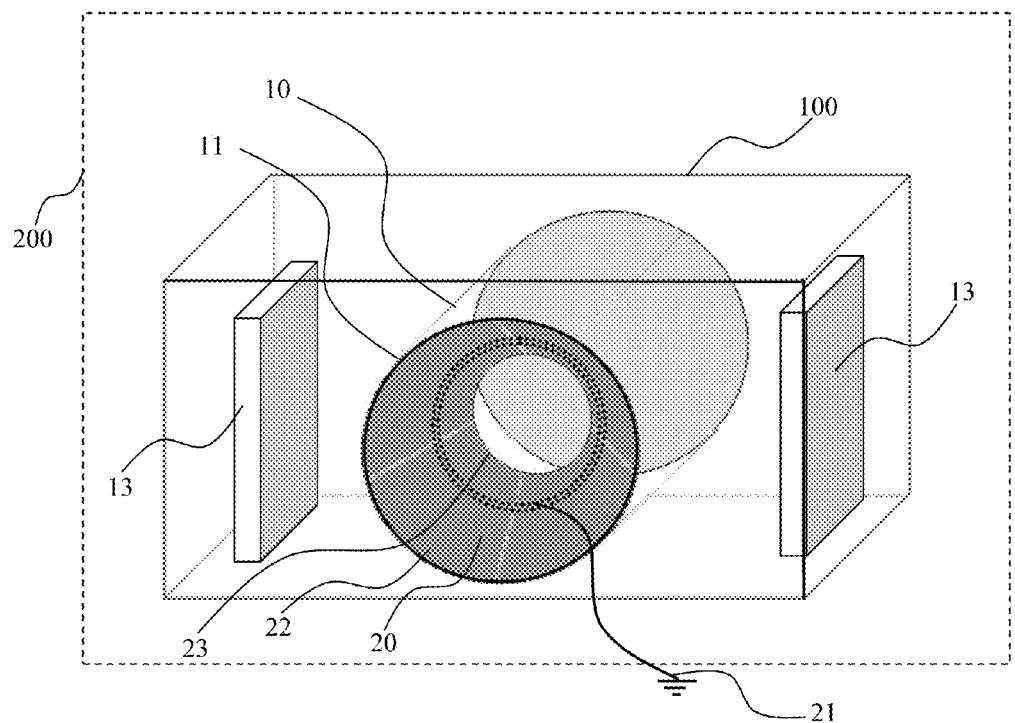
FIG. 1 and FIG. 2 schematically illustrate front view and a side view, respectively, of an open bore MRI device according to one embodiment of the invention comprising an RF protecting sleeve, insertably locatable within the bore.
Figure 2:
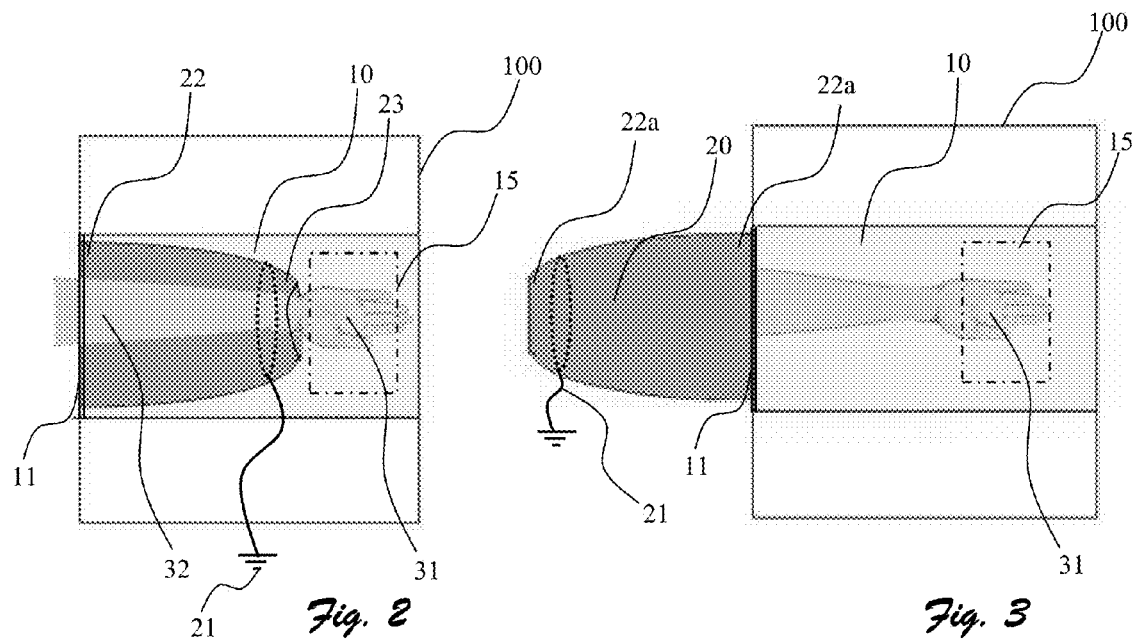

Reference is now made to FIG. 1 and FIG. 2, schematically illustrating an out-of-scale manner a front view and a side view, respectively, of an open bore MRI device (MRD, e.g., an MRI wrist system 100) according to one embodiment of the invention, comprising one or more magnets (here for example, permanent magnet 13) and a volume of interest (15) for imaging a predefined body portion (31) and an inlet aperture (11) for inserting a body portion within said bore (10), an electrically earthed (21) protecting sleeve (20) for reducing the electromagnetic energy propagation from said magnet bore (10) to the outer environment (200) surrounding MRD (100) and vice versa. Sleeve (20) comprises a distal portion (23) insertably locatable within bore (10) and a proximal portion (22) attachable to the MRD aperture (11), length and diameter of the sleeve is adapted to accept a non-imaged portion of a body portion (30) insertable within bore (10) whilst the imaged portion (31) protrudes from distal end (23) of sleeve.

Figure 3:
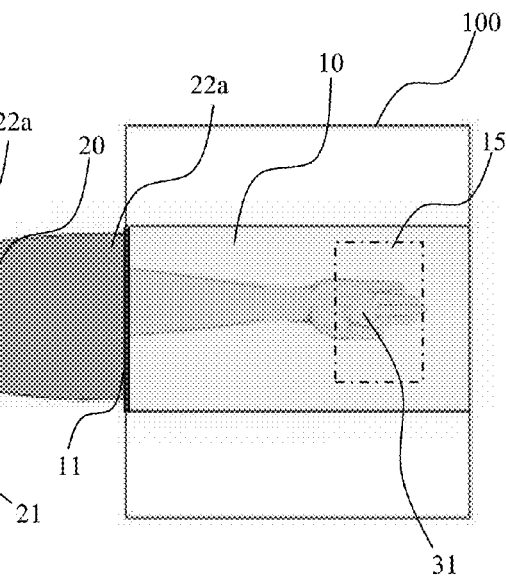
FIG. 3 schematically illustrating side view of an open bore MRD (100) according to yet a second embodiment of the invention in connection with an electrically earthed (21) protecting sleeve (20)

Reference is now made to FIG. 3, schematically illustrating an out-of-scale manner a side view of an open bore MRD (100) according to yet a second embodiment of the invention, having a volume of interest (15) for imaging a body portion (31) and an inlet aperture (11) for inserting body portion (31) within bore (10), an electrically earthed (21) protecting sleeve (22) for reducing the electromagnetic energy propagation from the magnet bore to the outer environment surrounding the magnet and vice versa. Sleeve (20) comprises a proximal portion (22a) locatable outside the bore and a distal portion (23a) attachable to the MRD aperture (11).

Figure 4:
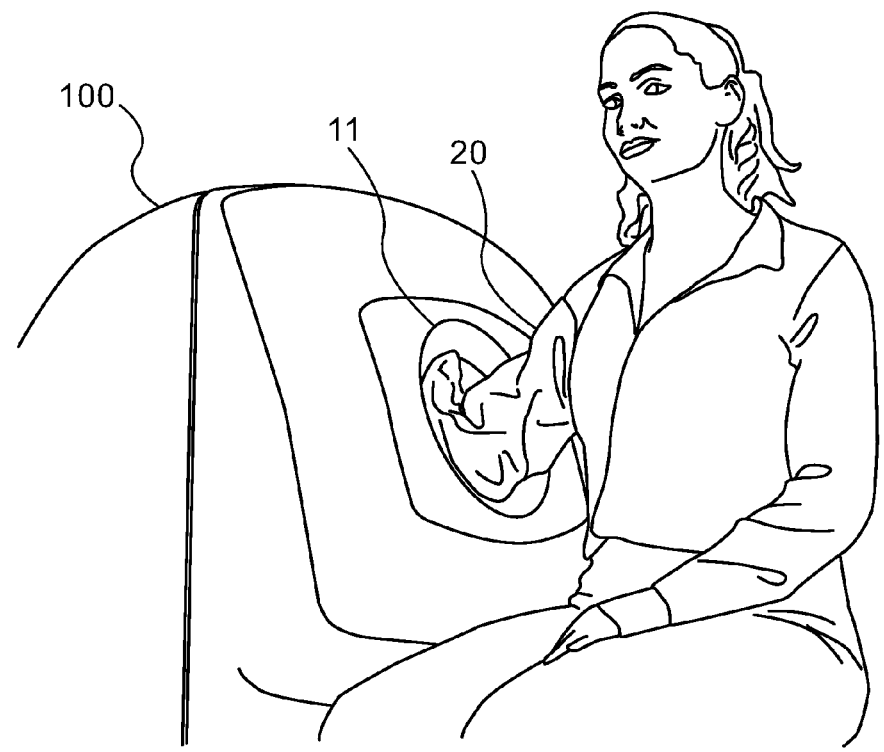
FIG. 4 showing a photograph of an open bore MRD (100) according to an example of the aforesaid second embodiment of the invention, wherein sleeve (20) protrudes outside the MRD's inner bore.

Reference is now made to FIG. 4, showing a photograph of an open bore MRD (100) according to an example of the aforesaid second embodiment of the invention. Sleeve (20) protrudes outside the MRD's inner bore and is connected to bore's inlet aperture (11).

Figure 5:
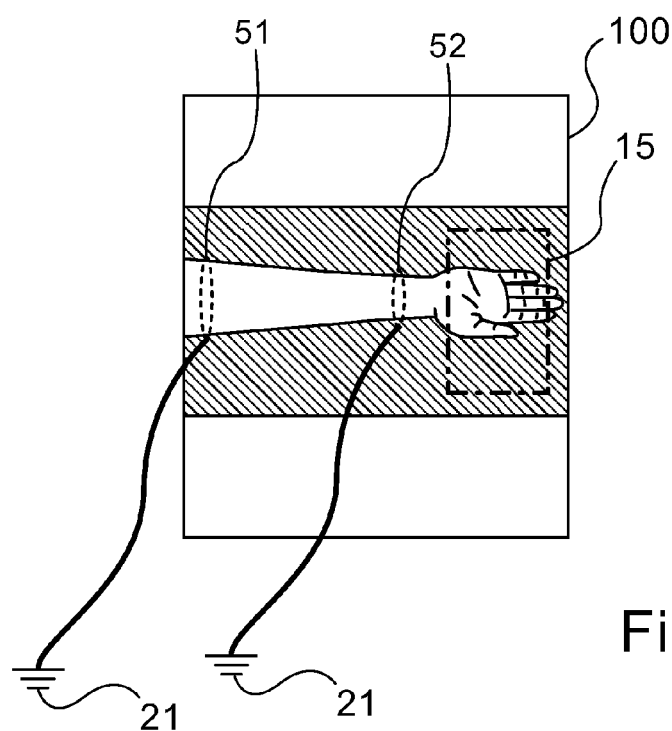
FIG. 5 schematically illustrating a side view of an MRD (100) according to yet a forth embodiment of the invention, in connection with one or more electrically earthed (21) protecting members (51, 52)

Reference is now made to FIG. 5, schematically illustrating an out-of-scale manner a side view of an MRD (100) according to yet a forth embodiment of the invention. The MRD having a volume of interest (15) for imaging a body portion and one or more electrically earthed (21) protecting members (51, 52), such a sleeves, dresses, bands, bracelets, collars, tourniquet, tags, clips etc., each of which is made of MRI safe materials, such as cupper and electrically conducting polymers. The protecting members are provided useful for reducing the electromagnetic energy propagation from MRD (100) to the outer environment surrounding the MRD and vice versa. Properties of members 51 and 52, such as length and diameter are set as a function of the dimensions of the portion of body to be analyzed. It is in the scope of the invention wherein two or more protecting members are interconnected by means of electrically conductive materials.

Figure 6:
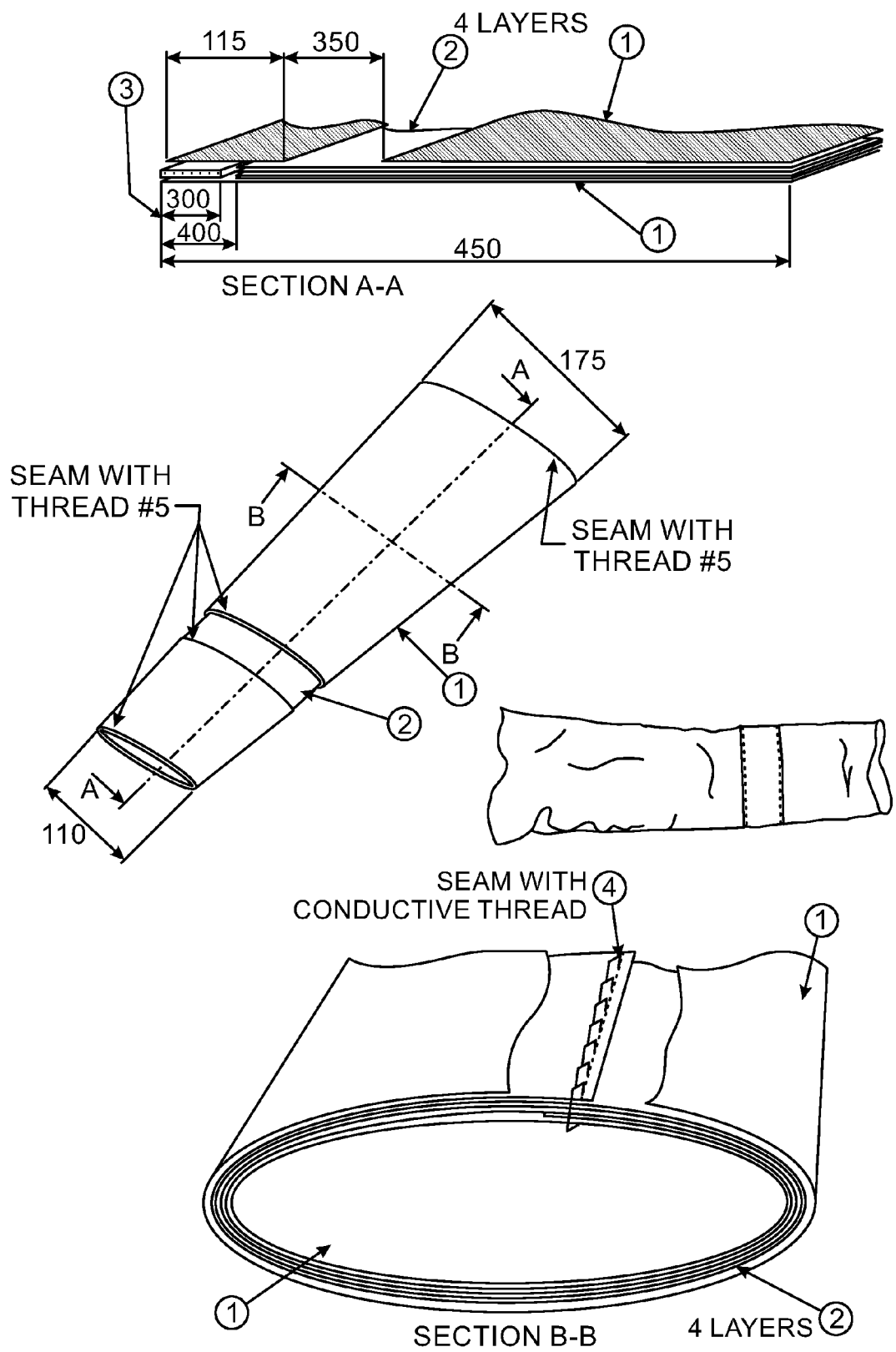
FIGS. 6 and 7, schematically illustrating various sections and portions of a tourniquet-like protecting sleeve according to one embodiment of the invention.
Figure 7:
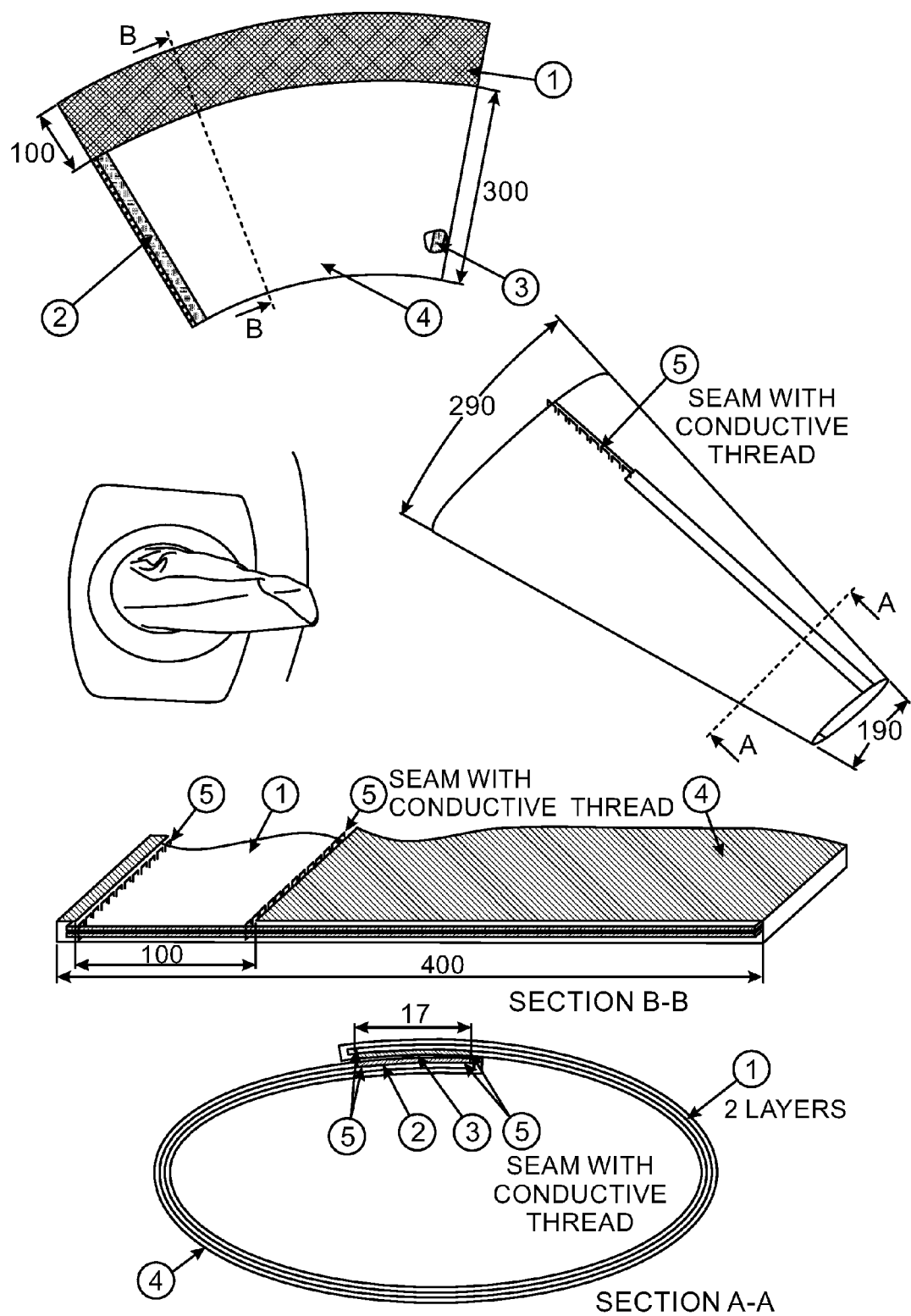

Reference is now made to FIGS. 6 to 7, schematically illustrating sections and portions of a tourniquet-like protecting sleeve. In this example, provided herein as an example, sleeve comprises a copper net or a layer comprising any other electrically conductive materials (1), an electrically conductive hook (2), an electrically conductive loop (3), a fabric sleeve (4), a conductive thread (5), an outer conducting strip for connection to an external protective earthing system; and a fastening means.

Figures 8, 9:
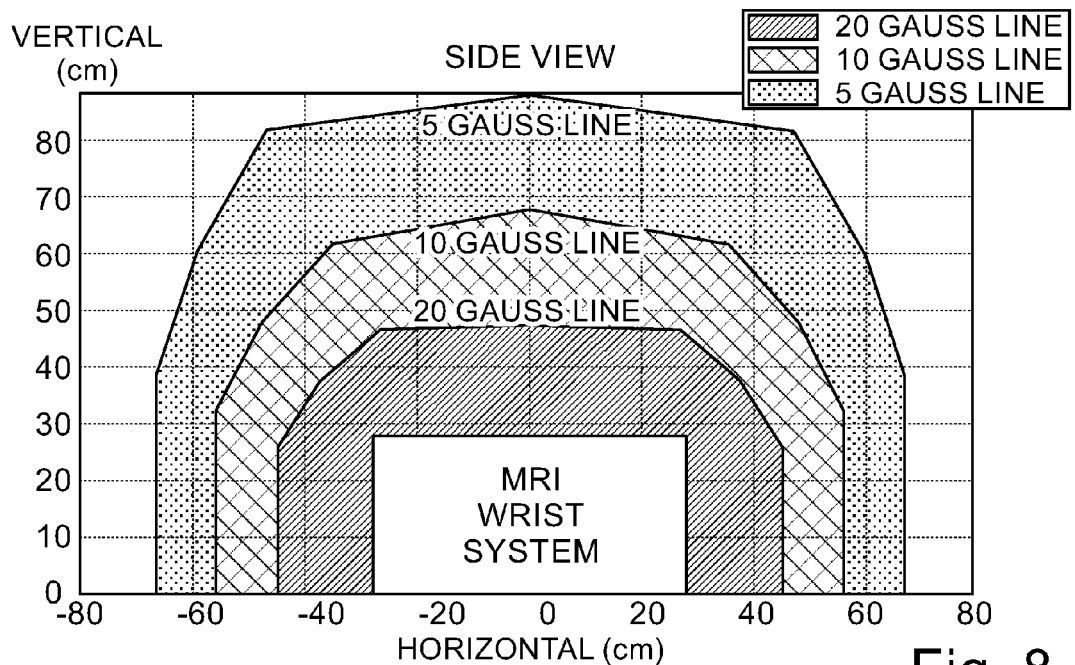
FIGS. 8 and 9 schematically illustrating side view and top views, respectively, of Fringe field 5 Guass line of an M2 type MRI by Aspect Imaging Ltd (IL) in connection with a protecting sleeve (MRI wrist system) according to the second embodiment of the invention.

Reference is now made to FIG. 8-9, schematically illustrating Fig side view and top view, respectively, of Fringe field 5 Guass line of an M2 type MRI by Aspect Imaging Ltd (IL) in connection with a protecting sleeve (MRI wrist system) according to the second embodiment of the invention.

It is in the scope of the invention wherein the conductive material is a copper net or an electrically conductive layer thereof. It is further in the scope of the invention wherein the electrically conductive materials are selected, in a non limiting manner from a group consisting of non-magnetic, electrical conductor, such as copper, silver, or aluminum, conductive polymers, such as polyacetylene, polyaniline, polypyrrole, polythiophene, and polyphenylene; synthetic or non-synthetic fibers which comprise carbon derivatives such as carbon nanotubes, carbon black, graphite; fabrics incorporated with inorganic conductive materials, tin oxide, copper sulfide, nickel graphite and any combination thereof.

It is further in the scope of the invention wherein the electrically conductive material or layer thereof is in the form of a mesh or a knitted fabric such that said mesh size is significantly smaller than the wavelengths to be reflected. It is further in the scope of the invention wherein the protective member comprises at least one of the following: layer of fabric or textile such as cotton, polyester, nylon and silk, high-performance fibers including Kevlar®, Nomex®, Technora® and Vectran®, for close-fitting on said cylindrical organ. It is further in the scope of the invention wherein two or more layers of fabric are in fluid connection to a fluid source and pump, positioned to entrap a fluid therein, thereby providing expansion of the fabric sleeve to fit dimensions of said organ in a tourniquet-like manner. It is further in the scope of the invention wherein the protecting member is designed to provide an effective insulation for non imaged body extremities. It is further in the scope of the invention wherein the electrically conductive loop is connected to the protective earthing terminal in a way that they cannot be separated without the aid of a tool, according to IEC 60601-1-2 Medical Electrical Equipment standards. It is further in the scope of the invention wherein RF field effects are caused by one or more of the following: external RF such as radio waves from the vicinity of said MRD suite and RF electromagnetic radiation produced by nuclear relaxation inside the subject or internal RF from the radio frequency transmission system of said MRD, or any combination thereof. It is further in the scope of the invention wherein the protecting member provides an effective Faraday shielding thus performing as a barrier to prevent entry of external RF from the environment of the MRD to the MRD's bore and vice versa.

In one example, yet still in a non limiting manner, a protective member as shown in any of the embodiments illustrated and disclosed in FIG. 1-4, effectively reduces internal RF field effects within the MRD's bore at frequencies of about 100 MHz, and eliminate ohmic tissue heating, heating of conductors, and interference with patient monitoring equipment; and vice versa, the protecting gear reduces external RF field effects of the environment of the MRD to penetrate the inner bore and VOI of the MRD.

In another example, provided herein still in a non limiting manner, a protective member as shown in any of the embodiments illustrated and disclosed in FIG. 1-4, effectively eliminates tissue heating due to RF magnetic fields during MR scanning, and limited temperature rise in excess of 1° C. and localized heating up to 38° C. in the head, 39° C. in the trunk, and 40° C. in the extremities.

In another example, provided herein still in a non limiting manner, a protective member as shown in any of the embodiments illustrated and disclosed in FIG. 1-4, effectively maintains SAR recommended levels below values as follows: 4 Watt/kg averaged over the whole body for any 15-minute period (1.5 Watt/kg if patient is thermally compromised, as a function of room temperature and humidity), 3.2 Watt/kg averaged over the head for any 10-minute period, and 8 W/Kg in any 1 cc of tissue in head averaged over 5 minutes.

In another example, provided herein still in a non limiting manner, a protective member as shown in any of the embodiments illustrated and disclosed in FIG. 1-4, effectively maintain magnetic fringe field at the entrance to MRI suite to be equal to or less than 5 Gauss, referred to as the 5-Gauss line.

In another example, provided herein still in a non limiting manner, a protective member as shown in any of the embodiments illustrated and disclosed in FIG. 1-4, effectively maintain prevents temperature rise due to RF heating during MR scanning beyond said limit of 40° C. in said body extremity.

In another example, provided herein still in a non limiting manner, a protective member as shown in any of the embodiments illustrated and disclosed in FIG. 1-4, is adapted to fit one or more of said body extremities such as a toe, a finger, a wrist, an elbow, an ankle, a knee, a head, non-body extremities such as the abdomen, belly etc, and any combination thereof.

In another example, provided herein still in a non limiting manner, a protective member as shown in any of the embodiments illustrated and disclosed in FIG. 1-4, is adapted to provide separation means of skin-to-skin contact of body parts selected from the group consisting inner thigh-to-thigh, calf-to-calf, hand-to-hand, hand-to-body, ankle-to-ankle contact, thereby preventing formation of conductive loops through part of the body.

In another example, provided herein still in a non limiting manner, a protective member as shown in any of the embodiments illustrated and disclosed in FIG. 1-4, is adapted to provide means for preventing placement of said body extremity against an RF transmitting coil surface.

In another example, provided herein still in a non limiting manner, a protective member as shown in any of the embodiments illustrated and disclosed in FIG. 1-4, is adapted to provide SAR conforming to NEMA MS-8-2006 for MRI Systems.

In another example, provided herein still in a non limiting manner, a protective member as shown in any of the embodiments illustrated and disclosed in FIG. 1-4, is adapted to adapted to fit an orifice of a body therein.

In another example, provided herein still in a non limiting manner, a protective member as shown in any of the embodiments illustrated and disclosed in FIG. 1-4, comprises as follows: A sleeve-like organ-accommodating article of manufacture comprising a fabric sleeve (1); an intermediate conducting layer (2); an outer dielectric layer (3) an outer conducting strip (4); wherein said fabric sleeve is adjusted to accommodate a body extremity, said intermediate conducting layer is placed/sewn/surrounds. said fabric sleeve, said outer dielectric layer is placed/sewn/surrounds said intermediate conducting layer, and said outer conducting strip is fastened to the outer dielectric layer with at least one contact with said intermediate conducting layer and at least one contact to an external earthing system (5).

In another example, provided herein still in a non limiting manner, a protective member as shown in any of the embodiments illustrated and disclosed in FIG. 1-4, applies with Electrical & Mechanical Safety (IEC 60601-1) General requirements for basic safety and essential performance.

In another example, provided herein still in a non limiting manner, a protective member as shown in any of the embodiments illustrated and disclosed in FIG. 1-4, applies with Electromagnetic Compatibility (IEC 60601-1-2) General requirements for basic safety and essential performance—Collateral standard: Electromagnetic compatibility—Requirements and tests.

In another example, provided herein still in a non limiting manner, a protective member as shown in any of the embodiments illustrated and disclosed in FIG. 1-4, applies with IEC 60601-2-33 Medical electrical equipment—Part 2-33: Particular requirements for the basic safety and essential performance of magnetic resonance equipment for medical diagnostic (2007 (Second Edition)+A1:2005+A2:2007).

In another example, provided herein still in a non limiting manner, a protective member as shown in any of the embodiments illustrated and disclosed in FIG. 1-4, applies with Acoustic Noise Measurement Procedure for Diagnosing Magnetic Resonance Imaging Devices In another example, provided herein still in a non limiting manner, a protective member as shown in any of the embodiments illustrated and disclosed in FIG. 1-4, applies with NEMA MS 8 (2006) Characterization of the Specific Absorption Rate (SAR) for MRI Systems.

In another example, provided herein still in a non limiting manner, a protective member as shown in any of the embodiments illustrated and disclosed in FIG. 1-4, applies with NEMA MS 10-2006 Determination of Local Specific Absorption Rate (SAR) in Diagnostic Magnetic Resonance Imaging.

In another example, provided herein still in a non limiting manner, a protective member as shown in any of the embodiments illustrated and disclosed in FIG. 1-4, applies with NEMA MS 11-2006 Determination of Gradient-Induced Electric Fields in Diagnostic Magnetic Resonance Imaging.

In another example, provided herein still in a non limiting manner, a protective member as shown in any of the embodiments illustrated and disclosed in FIG. 1-4, applies with IEC 60601-2-33 Medical electrical equipment—Part 2-33: Particular requirements for the basic safety and essential performance of magnetic resonance equipment for medical diagnostic (2007 (Second Edition)+A1:2005+A2:2007).

The invention claimed is:

1. An open bore magnetic resonance device (MRD), the open bore MRD comprising:
    a bore;
    an inlet aperture for inserting a body portion to be imaged within said bore; and
    a protecting sleeve that is grounded for reducing electromagnetic energy propagation from said bore to an outer environment surrounding said open bore MRD when the open bore MRD is emitting electromagnetic energy and vice versa,
    said protecting sleeve comprising: a) a distal portion that is insertable within said bore, and b) a proximal portion attachable to the inlet aperture, the protecting sleeve having a length and a diameter that allows said sleeve to accept the body portion such that a first portion of the body portion is positioned not to be imaged within said bore whilst a second portion of the body portion is positioned to be imaged and protrudes from said distal end of sleeve.

2. An MRD according to claim 1, wherein at least one portion of said sleeve comprises a copper net (an electrically conductive layer), an electrically conductive hook, an electrically conductive loop, a fabric sleeve, a conductive thread, an outer conducting strip, or any combination thereof, for connection to an external protective earthing system.

3. An MRD according to claim 1 wherein at least one portion of said sleeve comprises an electrically conductive layer.

4. An MRD device according to claim 1 wherein the protective member is adapted to fit any of the following body parts: toe, finger, wrist, elbow, ankle, knee, head, abdomen, and belly.

5. An MRD device according to claim 1 wherein the protective member is adapted to provide separation means of skin-to-skin contact of body parts from the group consisting inner thigh-to-thigh, calf-to-calf, hand-to-hand, hand-to-body, ankle-to-ankle contact, thereby preventing formation of conductive loops through part of the body.

6. A magnetic resonance imaging method, the method comprising:
    a. providing said open bore to comprise a volume of interest (VOI) for imaging a body portion and an inlet aperture for inserting said body portion within said VOI;
    b. providing a protective sleeve with length and diameter to accept a first portion of the body portion, the first portion not to be imaged;
    c. inserting the distal portion of said sleeve within said bore whilst attaching its proximal end to said aperture;
    d. grounding said sleeve;
    e. inserting a body portion through said aperture within said sleeve such that said a second portion of the body portion protrudes from said distal end of sleeve within said VOI and imaging the second body portion.

* * * * *